United States Patent [19]

Kawagoe et al.

[11] 4,161,664
[45] Jul. 17, 1979

[54] INPUT CIRCUIT

[75] Inventors: Hiroto Kawagoe, Kodaira; Kosei Nomiya, Tokyo, both of Japan

[73] Assignee: Hitachi, Ltd., Japan

[21] Appl. No.: 879,756

[22] Filed: Feb. 21, 1978

Related U.S. Application Data

[63] Continuation of Ser. No. 643,771, Dec. 23, 1975, abandoned.

[30] Foreign Application Priority Data

Jan. 6, 1975 [JP] Japan ................................ 50/000103

[51] Int. Cl.$^2$ ...................... H03K 3/353; H03K 17/08
[52] U.S. Cl. .................................. 307/304; 307/205;
307/214; 307/237; 307/296 R
[58] Field of Search ............... 307/202, 205, 214, 237,
307/251, 296, 297, 304, DIG. 1; 361/56, 90, 91;
357/41; 340/365 E, 365 S; 445/1

[56] References Cited

U.S. PATENT DOCUMENTS

| | | | |
|---|---|---|---|
| 3,549,903 | 12/1970 | Lodenslager | 307/251 |
| 3,586,883 | 6/1971 | Hayes | 307/251 |
| 3,588,537 | 6/1971 | Brink | 307/205 |
| 3,828,209 | 8/1974 | Kawagoe et al. | 307/251 |

OTHER PUBLICATIONS

Haskett; T. R., *Radio-Electronics*, Nov. 1964, pp. 33–36.

*Primary Examiner*—John Zazworsky
*Attorney, Agent, or Firm*—Craig and Antonelli

[57] ABSTRACT

An input circuit has at least an enhancement type first MISFET incorporated between an input terminal and a power supply terminal for the input circuit. A gate electrode of the first MISFET is connected to the power supply terminal, and at least a second MISFET is incorporated between the input terminal and a gate electrode of a third MISFET constituting the input circuit. A gate electrode of the second MISFET is connected to the power supply terminal, whereby the dielectric breakdown of the gate of the third MISFET is prevented.

6 Claims, 2 Drawing Figures

INPUT CIRCUIT

The present application is a Continuation of application Ser. No. 643,771, filed Dec. 23, 1975, now abandoned.

BACKGROUND OF THE INVENTION

Field of the Invention

This invention relates to an input circuit. More particularly, it is directed to an input circuit of a large-scale integrated circuit (hereinafter termed "LSI") which is composed of insulated gate field-effect transistors (hereinbelow termed "MISFETs")

BRIEF DESCRIPTION OF THE DRAWING

FIG. 1 is a circuit diagram showing an embodiment of the invention, while

DESCRIPTION OF THE PRIOR ART

In general, a small-sized electronic desk top calculator has its control circuit constructed of an MISLSI.

A circuit for driving a numerical display device in a small-sized electronic desk top calculator requires a high voltage output and, therefore, has not been fabricated as an LSI. With the progress of semiconductor integrated circuit technology, it has become possible to build up within an LSI a numerical display circuit requiring a high voltage output.

However, a new problem has arisen. In an electronic desk top calculator, an output signal of the display device must sometimes be employed as an input from a variety of functional requests, for example, the necessity for diminishing the number of external lead-out terminals. Since, in the past, the output signal level of the MISLSI was small, it offered no problem to directly apply the signal as an input. However, where the output signal has a high voltage signal level as described above a problem such as the dielectric breakdown of the gate of an input MISFET takes place.

As for a concrete example of employing the driving output for the numeral display device as the input signal, there is one to be explained below.

Figure 2:
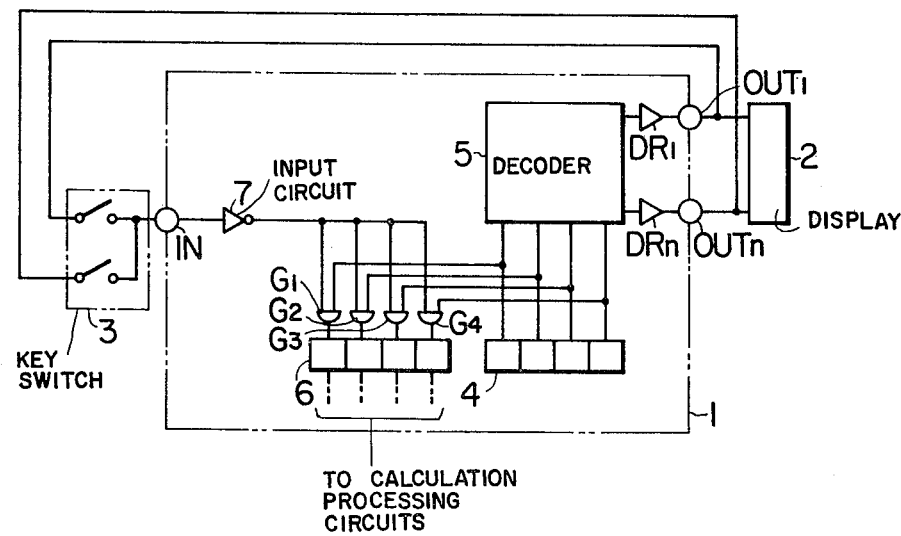
FIG. 2 is a circuit diagram of a key input circuit of an electronic desk top calculator formerly proposed by the inventors of the present application.

In order to simplify a key input circuit for an electronic desk top calculator, the inventors of the present application have formerly invented a key input circuit which dispenses with an encoder circuit for transforming a key input signal into a binary code as has hitherto been required. As is shown in FIG. 2, gate circuits $G_1$-$G_4$ are controlled by a key input which is synchronized with a digit signal the output of a semiconductor integrated circuit 1 and serving to drive a numerical display device 2, and a count pattern of a digit counter circuit 4 as passed through the gate circuits $G_1$-$G_4$ is loaded into an input buffer register 6 as a key input pattern.

Numeral 5 designates a decoder circuit for forming the digit signal, and symbols $DR_1$-$DR_n$ indicate high voltage output circuits.

In the key input circuit, the signal received through a key switch 3 is the digit signal for driving the numerical display device and therefore becomes the high voltage signal as explained previously. Regarding an input circuit 7 on which the signal is to be impressed, accordingly, the gate destruction of a constituent MISFET ascribable to a high amplitude signal level (30-35V or so) to be delivered to the numeral display device 2 must be prevented without exerting any influence on the signal level.

SUMMARY OF THE INVENTION

This invention has been made in order to solve the above problem, and has for its object to provide an input circuit which does not lower a high amplitude signal level to be impressed on a MISLSI and which lowers the high amplitude signal level only within the MISLSI.

The fundamental construction of this invention for accomplishing the object is characterized in that at least a first enhancement type MISFET is incorporated between an input terminal and a power supply terminal for the input circuit, a gate electrode of the first MISFET being connected to the power supply terminal, and that at least a second MISFET is incorporated between the input terminal and a gate electrode of a third MISFET constituting the input circuit, a gate electrode of the second MISFET being connected to the power supply terminal.

DETAILED DESCRIPTION

Figure 1:
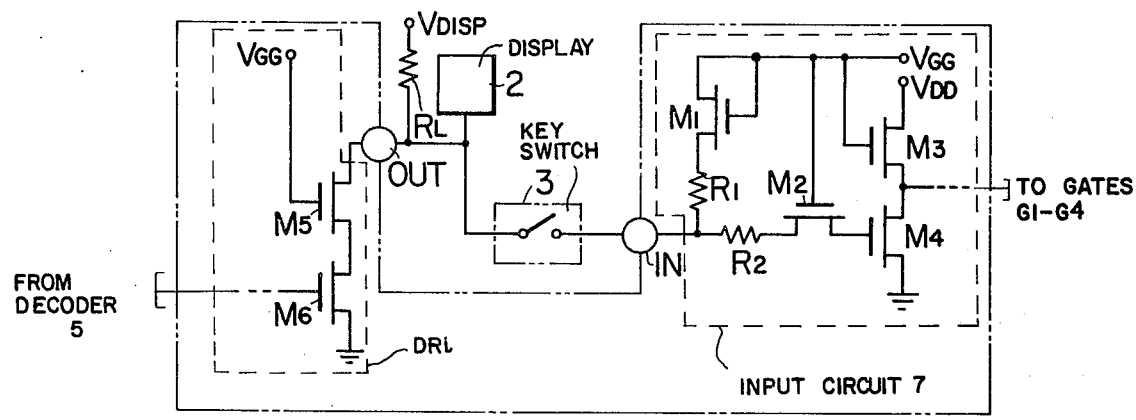

FIG. 1 is a circuit diagram illustrative of an example in the case where this invention is applied to an input circuit of an electronic desk top calculator. Detailed illustrations of an individual high voltage output circuit DRi among the high voltage output circuits $DR_1$-$DR_n$ and the details of the input circuit 7, shown in FIG. 2, referred to previously, are surrounded by broken lines in FIG. 1.

In the event that a high amplitude signal $V_{DISP}$ (30V-35V or so) which is formed by MISFETs $M_5$ and $M_6$ and which serves to drive a display device 2 is again received as an input at an input terminal IN through a key switch 3, the high amplitude signal is impressed on a driving MISFET $M_4$, constituting the input circuit, through the circuit to be described below, in order to prevent dielectric breakdown of the gate of the driving MISFET $M_4$ of the input circuit attributable to the high amplitude signal.

Between the input terminal IN to which the high amplitude signal is impressed and a terminal $V_{GG}$ of a low supply voltage (14 V or so) for the input circuit, an enhancement type MISFET $M_1$ and a resistance $R_1$ are connected in series, the gate electrode of the MISFET $M_1$ being connected to the supply terminal $V_{GG}$. Between the input terminal IN and the gate electrode of the driving MISFET $M_4$ of the input circuit, a resistance $R_2$ and a MISFET $M_2$ are connected in series, the gate electrode of the MISFET $M_2$ being connected to the supply terminal $V_{GG}$. MISFET $M_3$ is connected between MISFET $M_4$ and power supply terminal $V_{DD}$, the gate electrode of MISFET $M_3$ being connected to power supply terminal $V_{GG}$.

The resistance $R_1$ and $R_2$ connected in series with the respective MISFETs $M_1$ and $M_2$ are provided in order to protect the MISFETs $M_1$ and $M_2$ from dielectric gate breakdown. The resistances may have a value of approximately 1 kΩ-2kΩ, and can be made up as diffused regions within a single semiconductor substrate by impurity diffusion at the same time as the step of diffusing and forming the sources and drains of the MISFETs. The MISFET $M_2$ may be either of the enhancement type or of the depletion type.

With an input circuit of the above construction, when a high level signal is applied to the input terminal IN, the input side electrode (usually acting as the source electrode) of the MISFET $M_1$ receives a signal of a level greater than that of the power supply side electrode (usually acting as the drain electrode), and the electrodes act conversely. That is, the input side becomes the drain electrode and the power supply side the source electrode at this time. Since the source and the gate are accordingly at the same potential, the MISFET $M_1$ turns "off" and permits no current to flow between the high voltage power source and the low voltage power source at this time. Thus, the voltage to be impressed on the display device or the high output voltage can be maintained.

On the other hand, a voltage level to be applied to the gate of the driving MISFET $M_4$ of the input circuit does not become greater than $V_{GG}-V_{th2}$ under the action of the MISFET $M_2$ whose gate electrode receives the low supply voltage $V_{GG}$. Here, $V_{th2}$ denotes the threshold voltage of the MISFET $M_2$. In consequence, when the MISFET $M_2$ is a transistor of the enhancement type, the above voltage becomes $|V_{GG}-V_{th2}|$, while when it is a transistor of the depletion type, the above voltage becomes $|V_{GG}+V_{th2}|$. That is, the voltage level which is impressed on the gate of the MISFET $M_4$ is determined only by the supply voltage and the threshold voltage of the MISFET $M_2$. Thus, no high voltage is impressed on the gate electrode of the driving MISFET $M_4$, and dielectric gate breakdown of the MISFET $M_4$ is preventable.

The MISFET $M_1$ also functions to determine the voltage level which is impressed on the driving MISFET $M_4$ when the key switch 3 is "off".

This invention is not restricted to the foregoing embodiment, but it can adopt various aspects of performance.

By way of example, the resistances $R_1$ and $R_2$ for the protection of the MISFETs $M_1$ and $M_2$ to which the high voltage is applied may be externally-mounted resistances instead of diffused resistances. It is needless to say that, when gate insulation protection of the MISFETs $M_1$ and $M_2$ is not required, the protective resistances $R_1$ and $R_2$ are unnecessary.

This invention can be extensively utilized, not only for an electronic desk top calculator, but also for general circuits in which a high amplitude signal level to be impressed on a MISLSI is not lowered and in which the high amplitude signal level is lowered only within the MISLSI.

We claim:

1. In an input circuit for a MISFET integrated circuit, including at least an input terminal to which an input signal is applied, said input circuit comprising:
   a first field effect transistor having a conduction path between its source and drain coupled between said input terminal and a power supply terminal to which a voltage lower in absolute value than a high voltage potential of said input signal is applied, and having a gate to which is applied a voltage causing said first field effect transistor to cut off when said input signal is at said high voltage potential; and
   a second field effect transistor having a conduction path between its source and the drain coupled between said input terminal and a gate of a third field effect transistor and having a gate to which is applied a voltage lower in absolute value than said high voltage potential, to prevent said high voltage potential from being applied to the gate of said third field effect transistor.

2. The input circuit according to claim 1, further comprising a first resistor and a second resistor, each being coupled between said input terminal and the conduction paths of said first and second field effect transistors, respectively.

3. The input circuit according to claim 1, in which a signal source having said high voltage potential in one state is coupled to said input terminal by way of a switch, causing said input terminal to be electrically connected to said signal source in a closed state and to be isolated from said signal source in an opened state.

4. The input circuit according to claim 3, in which said signal source comprises an output circuit of said integrated circuit connected to an output terminal of the same integrated circuit and also, being coupled to a display device.

5. The input circuit according to claim 3, in which the gate of said first field effect transistor is coupled to said power supply terminal.

6. The input circuit according to claim 5, in which the gate of said second field effect transistor is coupled to said power supply terminal.

* * * * *